US006797131B2

United States Patent
Liu et al.

(10) Patent No.: US 6,797,131 B2
(45) Date of Patent: Sep. 28, 2004

(54) DESIGN OF HARDWARE FEATURES TO FACILITATE ARC-SPRAY COATING APPLICATIONS AND FUNCTIONS

(75) Inventors: Alan Barry Liu, Mountain View, CA (US); Chien-Shiung Tzou, Saratoga, CA (US); James Tsung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 5 days.

(21) Appl. No.: 10/293,641

(22) Filed: Nov. 12, 2002

(65) Prior Publication Data

US 2004/0089542 A1 May 13, 2004

(51) Int. Cl.$^7$ .......................... C23C 14/34; H05H 1/26
(52) U.S. Cl. ......................... 204/192.38; 204/298.11; 204/298.41; 427/446
(58) Field of Search ...................... 204/192.38, 298.41, 204/298.11, 298.12; 427/446

(56) References Cited

U.S. PATENT DOCUMENTS

| 5,178,739 | A | * | 1/1993 | Barnes et al. ........... 204/192.12 |
| 5,614,071 | A | * | 3/1997 | Mahvan et al. ......... 204/298.11 |
| 6,149,784 | A | * | 11/2000 | Su et al. ................. 204/298.11 |
| 6,394,023 | B1 | | 5/2002 | Crocker ....................... 116/208 |
| 6,428,663 | B1 | | 8/2002 | Mostovoy et al. ........... 204/298 |

* cited by examiner

*Primary Examiner*—Steven Versteeg
(74) *Attorney, Agent, or Firm*—Moser, Patterson & Sheridan

(57) ABSTRACT

A method and apparatus for forming a coating on a sputter chamber workpiece. The apparatus generally includes a sputter chamber having at least one workpiece. The at least one workpiece generally includes one or more trenches formed therein, the trenches being configured to define an arc spray coating region. The method generally includes forming one or more trenches in the workpiece, the trenches defining a coating region and applying a metal coating to the coating region by arc spraying.

17 Claims, 2 Drawing Sheets

DESIGN OF HARDWARE FEATURES TO FACILITATE ARC-SPRAY COATING APPLICATIONS AND FUNCTIONS

BACKGROUND OF THE INVENTION

1. Field of the Invention

Embodiments of the present invention generally relate to an apparatus and method for the fabrication of hardware for the production of semiconductor devices. More particularly, the present invention relates to arc spraying sputter chamber hardware to reduce substrate contamination.

2. Description of the Related Art

Sputtering is a method of depositing a material layer on a semiconductor substrate. A typical sputtering apparatus includes a target and a substrate support pedestal enclosed in a sputtering chamber. The target contains a material that is deposited onto the substrate. While sputtering is generally effective for film formation, material that deposits on surfaces within the deposition chamber other than those of the substrate may tend to flake or crumble from chamber surfaces as the chamber thermally cycles, particularly when a significant amount of material has accumulated. Such flaking or crumbling may cause substrate contamination.

Accordingly, in order to reduce this type of contamination, a need exists in the semiconductor fabrication field for an apparatus and method that reduces substrate contamination that occurs due to flaking or crumbling of sputtered particles which accumulate on chamber hardware.

SUMMARY OF THE INVENTION

Embodiments of the invention generally include a sputter chamber. The sputter chamber generally includes at least one workpiece having one or more trenches formed therein, the trenches configured to define an arc spray region.

Embodiments of the invention further provide a method of forming a coating on a sputter chamber workpiece. The method generally includes forming one or more trenches in the workpiece, the trenches defining a region to be coated and spraying within the trench boundaries with a metal spray coating to fill the trench to a desired thickness.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
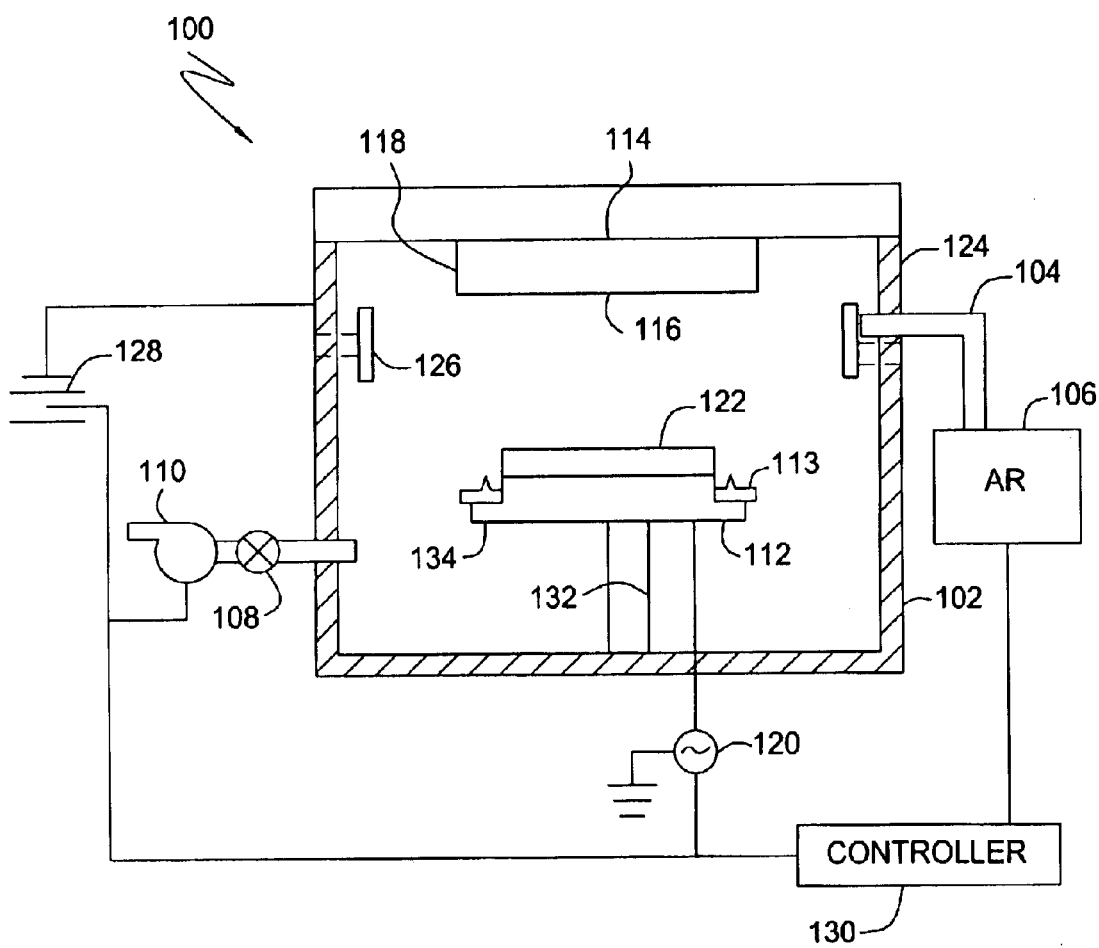
FIG. 1 is an illustration of a sputtering chamber.

FIG. 1 is an illustration of a sputtering chamber 100. The sputtering chamber 100 generally includes a sputtering chamber enclosure wall 102 having at least one gas inlet 104 coupled to a processing gas source 106, and an exhaust outlet 108 coupled to an exhaust pump 110. A substrate support pedestal 112 is generally disposed in the lower portion of the sputtering chamber 100, and a target 114 is mounted to or forms the upper portion of the sputtering chamber 100 as is conventionally known. The substrate support pedestal 112 is generally supported on a support apparatus 132, and optionally includes an electrostatic chuck (not shown), for retaining a workpiece or substrate 122 upon the surface of the substrate support pedestal 112. The substrate support pedestal 112 may further include a flange 134 that extends radially from the support 112 and circumscribes the entire support 112. This flange 134 supports a deposition ring 113. The deposition ring 113 generally prevents deposition on the side of the substrate support pedestal 112, as the substrate support pedestal 112 is generally difficult to remove from the sputtering chamber 100 for cleaning.

The target 114 has a front surface 116 and at least one sidesurface 118. Generally, targets are disk shaped, and thus have a single, circumferential side surface 118. An AC power supply 120 is operatively coupled to the substrate support pedestal 112 so that an AC power signal emitted from the AC power supply 120 may couple through the substrate support pedestal 112 to a substrate 122 positioned thereon.

The target 114 is electrically isolated from the sputtering chamber enclosure wall 102 by an insulation member 124. The sputtering chamber enclosure wall 102 is preferably grounded. A negative voltage is maintained on the target 114 (with respect to grounded sputtering chamber enclosure wall 102) via a DC power supply 128. A controller 130 is operatively coupled to the DC power supply 128, the gas inlet 104, the exhaust outlet 108, and the AC power supply 120.

In operation, a gas (e.g., argon) is charged into the sputtering chamber 100 through the gas inlet 104 at a selected flow rate regulated by the controller 130. The controller 130 also regulates the sputtering chamber pressure by throttling the rate at which the gas is pumped through the exhaust outlet 108. Accordingly, although a constant chamber pressure is maintained during sputtering, a continuous supply of fresh processing gas is supplied to the sputtering chamber 100.

The negative voltage applied to the target 114 excites the processing gas into a plasma state. Ions from the plasma bombard the target 114, causing the target atoms to sputter therefrom. The sputtered target atoms travel along linear trajectories from the target 114 and deposit on the substrate 122.

Portions of the sputtered target atoms may become scattered in the plasma and eventually accumulate on other surfaces within the sputtering chamber 100, including the sidesurface 118 of the target 114 and the deposition ring 113. As stated previously, the sputtered target atoms that do not deposit on the substrate are referred to herein as sputtered particles. A portion of sputtered particles which are not strongly adhered to the sidesurface 118 of the target 114 may flake or crumble therefrom as the sputtering chamber 100 thermally cycles. Such flaking or crumbling sputtered particles may settle contaminate the substrate 122. Any sputtered particles that accumulate on the insulation member 124 may cause an electrical short circuit between the sputtering chamber enclosure wall 102 and the target 114. Such an electrical short circuit may cause the sputtering chamber 100 to malfunction. Therefore, a shield 126 is generally positioned to prevent sputtered particles from accumulating on the insulation member 124 and also to prevent particles from accumulating on the sputtering chamber enclosure surface 102 as particles may crumble therefrom, creating a potential source of substrate contamination.

Various approaches have been employed in an effort to reduce the contamination of substrates that occurs due to sputtered particles flaking or crumbling from the hardware of the sputtering chamber 100. For example, a coating, such as a metal spray coating may be applied to hardware in the sputtering chamber 100. Such coatings generally have a rough surface finish, e.g., a surface roughness (RA) of greater than about 200 micro inches. The coating is generally of sufficient thickness as to prevent crumbling of sputtered particles. Although the thickness will depend on the specific sputtering process being performed, coating thicknesses of from about 150 micrometers to about 500 micrometers are generally sufficient. Further, the coating generally is a material having a thermal coefficient of expansion similar to that of the sputtered particles. For example, the coating may be aluminum, titanium, or some other metal. The roughness of the coating may significantly increase adhesion between the process chamber hardware and the sputtered particles accumulated thereon.

Arc spraying is a thermal spray technique in which a material in a form such as a powder, wire, or rod is fed to a torch or gun and then heated to a temperature close to or above the material's melting point. The resulting material is then accelerated in a gas stream and transported to the surface to be coated. In a typical arc spray process, the material to be deposited is in the form of two electrically opposed charged wires that are fed together so that a controlled arc occurs at the intersection of the wire tips. The molten material at the tips is atomized and propelled onto the surface to be coated by a stream of compressed air or other gas. The arc spray process generally offers a high deposition rate and is a relatively low cost process.

However, arc spraying is generally uncontrollable, which results in the inability to constrain the location of the spray, the thickness, the roughness and other properties of the post-spray coating on the part surface. Thus, an improved method is needed to provide surface roughness to sputter chamber hardware.

Figure 2:
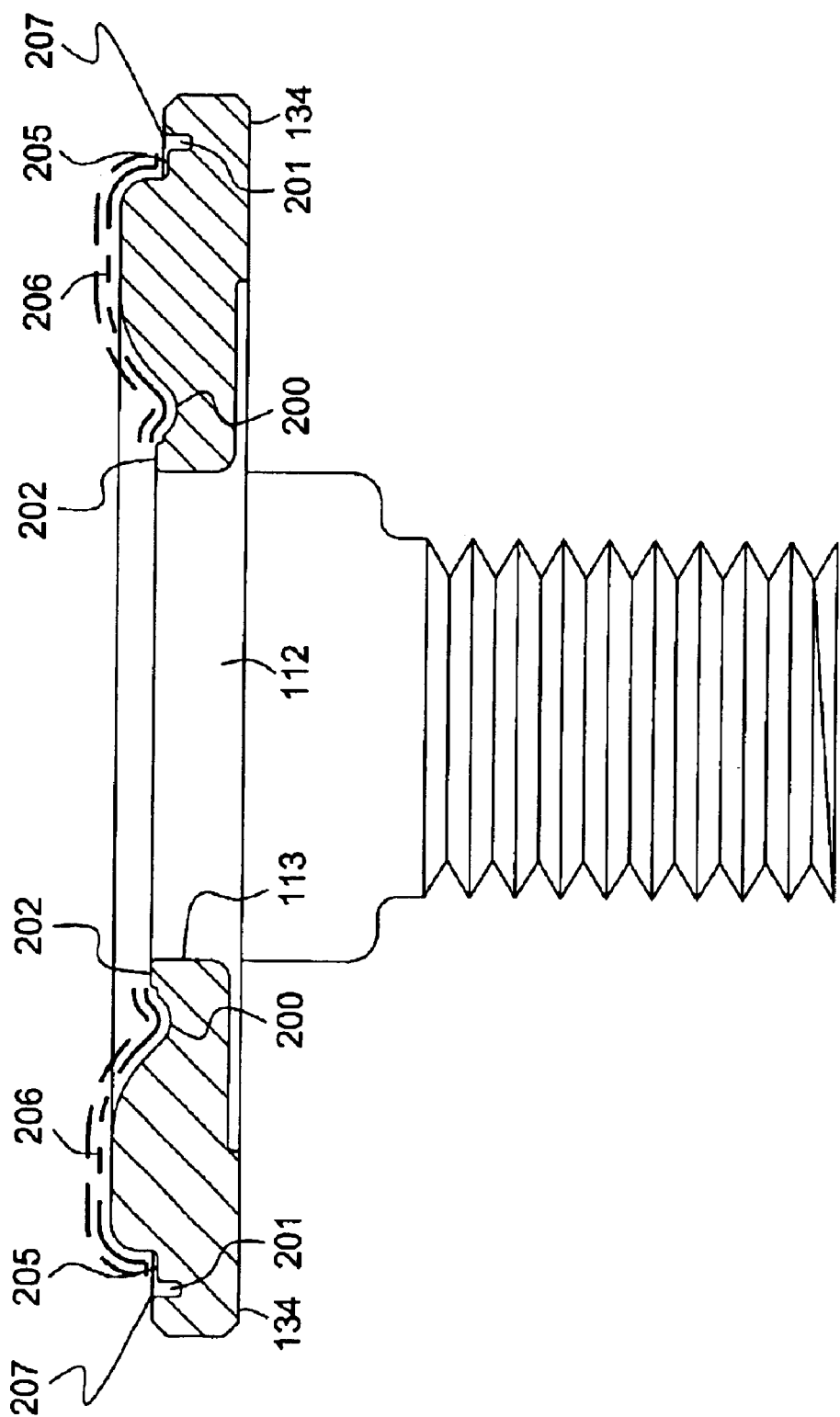
FIG. 2 is a side view of deposition ring including a trench to facilitate coating.

FIG. 2 is a side view of deposition ring 113 including a first trench 200 and a second trench 201 to facilitate coating. The deposition ring 113 generally includes a lip portion 202, which extends around the edge of the substrate support pedestal 112. The trenches 200 and 201 are precisely machined into the deposition ring 113, thereby providing arc spray control and repeatability when spraying multiple parts. The first trench generally has an inner surface 203 that may also be referred to as lip portion 202. The lip portion 202 generally defines the inner limit of the arc spray coating. The second trench 201 generally includes an outer surface 207 an intermediate surface 206, and an inner surface 205 which is the outer limit of the arc spray coating. The arc spray coating may include any metal coating capable of providing a roughened surface on the workpiece. In a specific embodiment, the coating provides a surface roughness of from about 700 micro inches to about 900 micro inches. The metal coating may be aluminum oxide. For example, in a specific embodiment, the metal coating is aluminum oxide having a purity of about 99.5%. The trenches 200 and 201 generally have rounded surfaces/edges, rather than rough surfaces or edges, whereby the coating may adhere. Workpieces that have a low surface tolerance, e.g., a critical distance between other parts, receive a predetermined coating thickness determined by the distance and the depth of the trenches 200 and 201. For example, the coating thickness is generally from about 0.001 inches to about 0.020 inches. In a specific embodiment, the coating thickness is from about 0.006 inches to and about 0.009 inches. While the thickness is generally predetermined in the coating region, the coating thickness may vary at different locations throughout the coating region. Methods for forming trenches 200 and 201 are known to those skilled in the art.

The trenches 200 and 201 also facilitate masking process to further inhibit errant spraying of the deposition ring 113. Surfaces that are not to be coated may be covered with a mask, which is removed after the coating is applied to the hardware. The mask may easily be applied to the surfaces of the trenches 200 and 201 for repeatability between workpieces.

Although the embodiments of the present invention have been described primarily as applied to a deposition ring, any surface within the sputtering chamber 100 may benefit from use of the present invention. For example, the embodiments described herein may be applied to a cover ring, chamber sidewalls, the target, the backing plate or a dark space shield. Embodiments of the invention may also be used within a conventional high-density plasma-type sputtering chamber having a coil (not shown).

While the foregoing is directed to embodiments of the present invention, other and further embodiments of the invention may be devised without departing from the basic scope thereof, and the scope thereof is determined by the claims that follow.

What is claimed is:

1. A sputter chamber, comprising:
    at least one deposition ring in physical contact with a substrate support pedestal and having one or more trenches formed therein, the trenches being configured to define an arc spray coating region having a coating formed thereon.

2. The sputter chamber of claim 1, wherein the arc spray coating region is configured to have a coating with a thickness of from about 0.001 inches to about 0.020 inches.

3. The sputter chamber of claim 1, wherein the arc spray coating region is configured to have a coating with a thickness of from about 0.006 inches to about 0.009 inches.

4. The sputter chamber of claim 1, wherein the coating comprises aluminum oxide.

5. The sputter chamber of claim 4, wherein the coating provides a surface roughness of from about 150 micrometers to about 500 micrometers to the arc spray coating region.

6. A sputter chamber, comprising:
    at least one deposition ring having one or more trenches formed therein, the trenches being configured to define an arc stray coating region having a coating formed thereon
    wherein the deposition ring is formed of titanium.

7. A method of forming a coating on a deposition ring contacting a substrate support pedestal in a sputter chamber, comprising:
    forming one or more trenches in the deposition ring, the trenches defining a coating region; and
    forming a coating on the coating region by arc spraying.

8. The method of claim 7, further comprising masking the one or more trenches to prevent overspray on the deposition ring.

9. The method of claim 7, wherein the coating has a thickness of from about 0.001 inches to about 0.020 inches.

10. The method of claim 7, wherein the coating has a thickness of from about 0.006 inches to about 0.009 inches.

11. The method of claim 7, wherein the one or more trenches comprise a first trench and a second trench, the first and second trenches having an inner surface and an outer surface.

12. The method of claim 11, wherein the coating region is defined by the inner surface of the first trench and the inner surface of the second trench.

13. The method of claim 11, wherein a location of the at least one trench is transmitted to a sprayer to define the coating region.

14. A sputter chamber deposition ring, for placement on a substrate support pedestal, comprising:

a titanium ring having a lower surface for contacting the substrate support pedestal; the titanium ring having one or more trenches formed therein, the trenches being configured to define an arc spray coating region having a coating to provide a surface roughness in the coating region of from about 150 micrometers to about 500 micrometers.

15. The sputter chamber deposition ring of claim 14, wherein the one or more trenches comprise a first trench and a second trench, the first and second trenches having an inner surface and an outer surface.

16. The sputter chamber deposition ring of claim 15, wherein the coating region is defined by the inner surface of the first trench and the inner surface of the second trench.

17. The sputter chamber deposition ring of claim 14, wherein the at least one trench extends along the entire periphery of the deposition ring.

* * * * *

UNITED STATES PATENT AND TRADEMARK OFFICE
CERTIFICATE OF CORRECTION

PATENT NO. : 6,797,131 B2 Page 1 of 1
APPLICATION NO. : 10/293641
DATED : September 28, 2004
INVENTOR(S) : Alan Barry Liu, Chien-Shiung Tzou and James Tsung It is certified that error appears in the above-identified patent and that said Letters Patent is hereby corrected as shown below:

Column 2, Line 59: After "settle", insert --and--

Column 3, Line 51: Insert a comma after "207"

Column 4, Claim 6, Line 51: Change "stray" to --spray--

Signed and Sealed this

Twenty-second Day of August, 2006

JON W. DUDAS
*Director of the United States Patent and Trademark Office*